(12) United States Patent
Gould et al.

(10) Patent No.: US 7,571,297 B2
(45) Date of Patent: Aug. 4, 2009

(54) DATA INVALID SIGNAL FOR NON-DETERMINISTIC LATENCY IN A MEMORY SYSTEM

(75) Inventors: Geoffrey Gould, El Dorado Hills, CA (US); Brent M. Ahlquist, Loomis, CA (US)

(73) Assignee: Intel Corporation, Santa Clara, CA (US)

( * ) Notice: Subject to any disclaimer, the term of this patent is extended or adjusted under 35 U.S.C. 154(b) by 383 days.

(21) Appl. No.: 11/323,174

(22) Filed: Dec. 30, 2005

(65) Prior Publication Data

US 2007/0156991 A1    Jul. 5, 2007

(51) Int. Cl.
*G06F 12/00* (2006.01)

(52) U.S. Cl. .................................................... 711/167
(58) Field of Classification Search ...................... None
See application file for complete search history.

(56) References Cited

U.S. PATENT DOCUMENTS 5,944,805 A * 8/1999 Ricks et al. ................. 710/107
7,257,632 B2 * 8/2007 Zhang et al. ................ 709/226

* cited by examiner

*Primary Examiner*—Hiep T Nguyen
(74) *Attorney, Agent, or Firm*—Kacvinsky LLC (57) ABSTRACT

An apparatus, system, and method for a data invalid signal for non-deterministic latency in memory are described. The apparatus may include a memory to determine that data to be buffered for a data burst cannot be guaranteed in time to satisfy a deterministic latency parameter. The memory may provide an indication that the data cannot be guaranteed. Other embodiments are described and claimed.

20 Claims, 3 Drawing Sheets

DATA INVALID SIGNAL FOR NON-DETERMINISTIC LATENCY IN A MEMORY SYSTEM

BACKGROUND

Conventional memory controllers schedule future memory commands into a pipeline. Some memory specifications, such as for double data rate (DDR) synchronous dynamic random access memory (SDRAM), define foreknown deterministic latencies for scheduling memory commands. For SDRAM, deterministic read latencies enable the memory controller to predict when requested data will be available after a memory core sensing operation.

As the size of memory cells continues to shrink, more phenomena of physics may hinder read operation quality and reliability. Some memory products may include internal mechanisms to quickly correct a small number of bit errors. In such products, the delay of the error-correction may be included in the deterministic read latency applicable to every memory core sensing operation, even those sensing operations which do not require error-correction for a particular iteration.

In the future, a larger percentage of read operations may require error-correction. Deterministic latency requirements often may be satisfied even when performing error-correction, such as for single-bit errors. However, complex error-correction operations may require a longer sensing delay. There is a need, therefore, for memory systems and techniques to provide non-deterministic latency.

DETAILED DESCRIPTION

Figure 1:
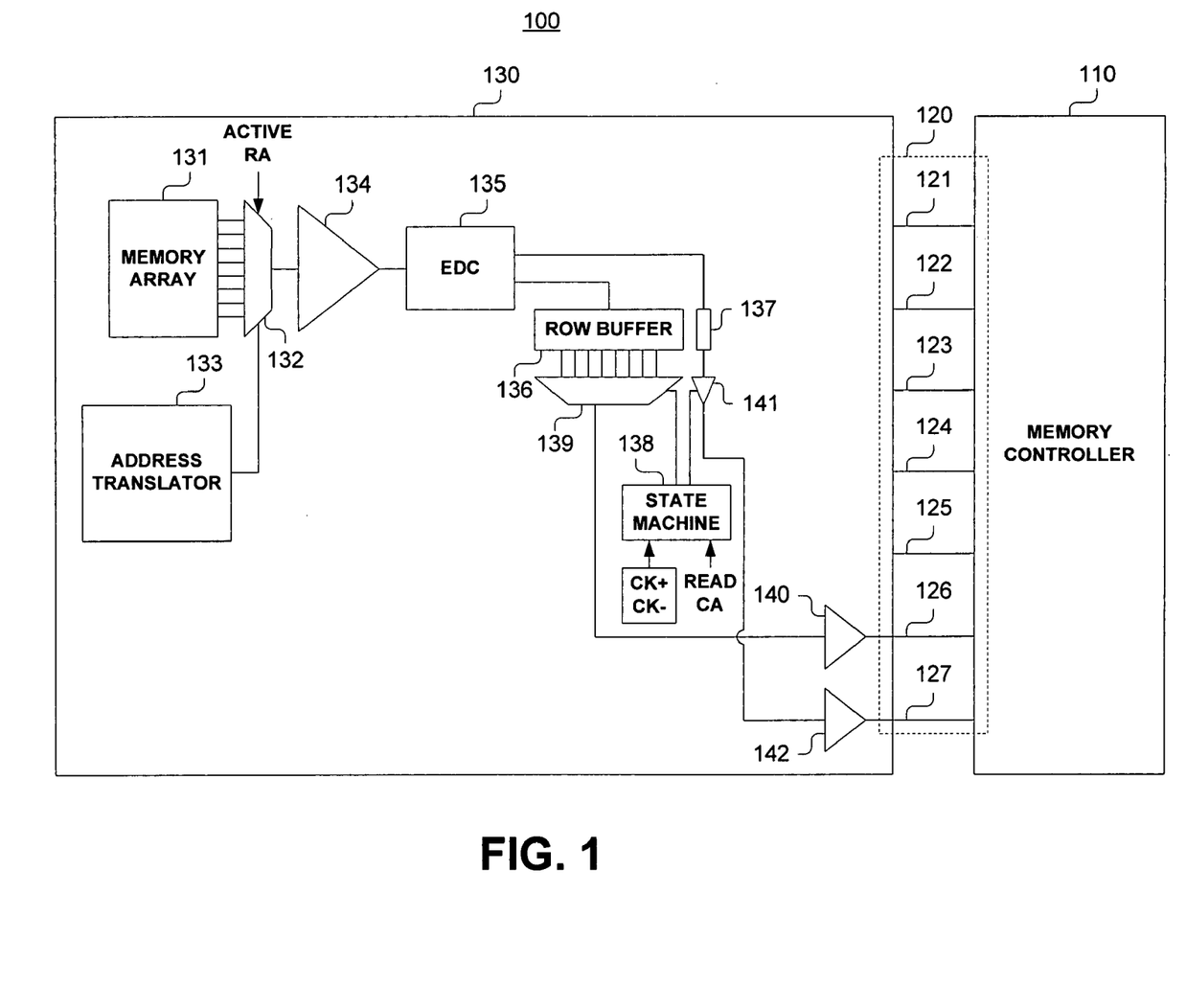
FIG. 1 illustrates one embodiment of a memory system.

FIG. 1 illustrates one embodiment of a memory system 100. The memory system 100 generally may comprise various physical or logical entities for receiving and storing and transmitting information. The memory system 100 may be illustrated and described as comprising various functional blocks. Such blocks may comprise or be implemented by one or more hardware components, logic components, and/or combination thereof. For example, the blocks may comprise, or be implemented as, a processing system, a processing subsystem, a microprocessor, a processor such as general purpose processor, a digital signal processor (DSP) and/or a network processor, an integrated circuit such as an application specific integrated circuit (ASIC), a programmable logic device (PLD), a circuit, a logic gate, switch, a register, a semiconductor device, a chip, a transistor, or any other device, machine, tool, equipment, component, or combination thereof, as desired for a given set of design or performance constraints. Although certain blocks may be described by way of example, it can be appreciated that a greater or lesser number of blocks may be used and still fall within the scope of the embodiments.

As shown in FIG. 1, the memory system 100 may comprise a memory controller 110 coupled through an interconnect 120 to a memory device 130. In various embodiments, the memory controller 110 and the memory 130 may comprise, or be implemented by separate chips, dies, or integrated circuits (ICs) coupled through the interconnect 120. In such embodiments, the memory controller 110 and the memory 130 each may comprise a semiconductor substrate and circuitry designed to perform one or more operations. The circuitry may comprise various processing components implemented by microelectronic, mechanical, and/or electromechanical elements fabricated on the substrate using silicon-based IC processes such as bipolar, complementary metal oxide semiconductor (CMOS), and bipolar CMOS (BiCMOS) processes, for example.

In various embodiments, the interconnect 120 may comprise a collection of buses, that interconnect the memory controller 110 and the memory device 130. The buses may comprise, for example, conductive lines for carrying signals between the memory controller 110 and the memory device 130. Although the interconnect 120 may be illustrated and described as comprising a certain number of buses for ease of understanding, it may be appreciated that the interconnect 120 may comprise any bus architecture and may include any number and combination of buses.

The memory 130 generally may be implemented by an IC and may comprise one or more types of computer-readable storage media capable of storing data, including both volatile and non-volatile memory. The memory 130 may comprise, for example, read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

The memory 130 may be arranged to store one or more types of information, such as media information and control information. Information generally may refer to data, instructions, and/or or code and typically may be stored in bits, bytes, and/or words. Media information generally may refer to any data representing content meant for a user, such as image information (e.g., digital photographs, user interfaces, Web pages, graphics), audio information (e.g., music, sounds, ring tones), video information (e.g., video files, video clips, movies, broadcast programming), audio/video (A/V) information, voice information, textual information (e.g., e-mail messages, text messages, instant messages, contact lists, task lists, calendar entries, hyperlinks), numerical information, alphanumeric symbols, character symbols, and so forth. Control information generally may refer to any data representing commands, instructions or control words meant for an automated system. For example, control information may be used to route media information through a system or to process the media information in a certain manner. The embodiments are not limited in this context.

In general, the memory 130 may be used to store both static and dynamic information. Static information may comprise any stored information that may not be altered, changed or updated. Examples of static information include read-only data and read-only code. Dynamic information may comprise any stored information that may be altered, changed, and/or updated. Examples of dynamic information include read/write data and read/write code. The embodiments are not limited in this context.

In various embodiments, the memory controller 110 and the memory 130 may be arranged to communicate through the interconnect 120 according to a bus protocol. The bus protocol may comprise, for example, a SDRAM protocol such as a double data rate (DDR) protocol, low power DDR (LPDDR) protocol, row address strobe/column address strobe (RAS/CAS) protocol, or any other suitable volatile or non-volatile protocol.

In general, the bus protocol may describe or define logic (e.g., type, order, timing) by which signals are communicated through the interconnect 120 between the memory controller 110 and the memory 130. In various implementations, the bus protocol may define one or more timing or latency parameters for communicating signals between the memory controller 110 and the memory 130. The latency parameters may comprise, for example, foreknown deterministic latencies for scheduling memory commands.

In various embodiments, the latency parameters may comprise a time from RAS to CAS delay (tRCD) parameter. The tRCD parameter may comprise a minimum delay for the memory controller 110 between issuing an ACTIVE command and issuing a READ command to the same memory bank in the memory 130. In various implementations, the tRCD parameter also may account for error-correction delay. The tRCD parameter may be expressed in terms of nanoseconds (e.g., 30 ns) and/or clock periods (e.g., 6 clock periods depending on the clock frequency).

The latency parameters may comprise a CAS latency (CL) parameter. The CL parameter may comprise the expected number of clock periods (e.g., 3 clock periods) for the memory controller 110 to receive data after issuing a READ command. For example, the memory controller 110 may issue an ACTIVE command to activate a row in a particular memory bank in the memory 130. In response to the ACTIVE command, the memory 130 may perform error-correction and buffer the data in anticipation of a READ command from the memory controller 110. After a delay of tRCD, the memory controller 110 may issue the READ command, and after a delay of CL, the memory controller 110 may expect to receive the requested data from a data bus.

In various implementations, the bus protocol may define a burst length (BL) parameter. The BL parameter may comprise the number of words driven to the data bus in response to a READ command. For example, a BL of four (BL=4) may drive four words of data to the data bus in response to a single READ command. In various embodiments, the memory 130 may employ a 2n-prefetch internal bus, where two words are pulled from a buffer (e.g., row buffer) at one time using an internal bus twice as wide as the external data bus. A BL of four words may use two time phases, first pulling the first 2 words of the read burst from the buffer, and later pulling the last 2 words of the read burst from the buffer.

In various embodiments, the signals communicated between the memory controller 110 and the memory device 130 may comprise, for example, a clock signal 121, an address signal 122, a bank address signal 123, a command signal 124, a data strobe signal (DQS) signal 125, a data (DQ) signal 126, and a DatumNotValid (DNV) signal 127.

The clock signal 121 may comprise, for example, a positive clock (CK+) signal and/or a negative clock (CK−) signal. The CK+ signal and the CK− signal may be opposite pulses comprising a differential clock to improve immunity to noise, clock jitter, and skew. In various implementations, the clock signal 121 may synchronize time between the memory controller 110 and the memory 130, for example, by synchronizing or registering signals with the rising edge of the CK+ signal.

The address signal 122 may comprise, for example, a row address (RA) signal or a column address (CA) signal. The bank address signal 123 may comprise, for example, a signal corresponding to a particular memory bank. In various implementations, the address signal 122 and the bank address signal 123 may be arranged to identify a particular storage location in memory 130. In various implementations, the address signal and/or the bank address signal may employ time-multiplexing to reduce pincount.

The command signal 124 may comprise, for example, an ACTIVE command signal or a READ command signal. In various embodiments, the command signal may comprise a binary representation of a chip select (CS#) signal, a row address strobe (RAS#), a column address strobe (CAS#) signal, and a write enable (WE#) signal. For example, an ACTIVE command may comprise CS#=Low, RAS#=Low, CAS#=High, and WE#=High.

The DQS signal 125 may comprise, for example, a strobe signal to recognize the arrival of data on a data bus. In general, the clock signal 121 is an outgoing signal from the memory controller 110 and the DQ signal 126 is a bi-directional signal (e.g., an incoming signal to the memory controller 110 during memory read operations and an outgoing signal from the memory controller 110 during memory write operations). Because the clock signal 121 and the DQ signal 126 may not always perfectly align, the incoming DQS signal 125 may be used to recognize when new data is arriving. In various implementations, the memory 130 that drives the DQ signal 126 during memory read operations also drives the rising and falling edge transitions of the DQS signal 125 during memory read operations. For example, every time the memory 130 drives a new word on the data bus, the memory 130 may toggle or invert a DQS pin. In such implementations, when the memory 130 drives the first word on the DQ signal 126, the memory 130 also may drive a rising edge transition on the DQS signal 125. When the memory 130 drives the next word, the memory 130 also may drive a falling edge transition on the DQS signal 125, and so forth.

In various embodiments, the DQS signal 125 may comprise a floating or high impedance state signal. In such embodiments, the DQS signal 125 may comprise a high, low, and high impedance (e.g., intermediate) state. In general, a high impedance state signal is not actively driven by the memory 130 allowing the signal to be shared and driven by multiple chips. When no chips are driving the DQS signal 125 (e.g., forcing a voltage), the DQS signal 125 may remain in the high impedance state. In various implementations, a high impedance signal may enable the memory controller 110 to communicate with several memories using shared signals.

The DQ signal 126 may comprise, for example, a data signal comprising one or more words of data. In various implementations, the DQ signal 126 may be driven on a data bus DQ[15:0] comprising 16 DQ pins. In general, the DQ signal 126 may be sent by the memory 130 in response to a READ command. In various embodiments, the DQ signal 126 may comprise a data burst (e.g., read burst) including multiple words driven in response to a READ command. The number of words in the data burst may correspond to a BL (e.g., BL=4), for example. In some embodiments, the DQ signal 126 may comprise a high impedance state signal having a high, low, and high impedance (e.g., intermediate) state and capable of being shared by multiple chips.

The DNV signal 127 may comprise, for example, a data invalid signal indicating that one or more words of a data burst (e.g., read burst) may be invalid or cannot be guaranteed to be valid. In various embodiments, the DNV signal 127 may indicate that one or more words of the DQ signal 126 may be invalid or cannot be guaranteed to be valid.

In various implementations, the DNV signal 127 may correspond to a condition where the memory 130 is unable to guarantee that data to be buffered for a data burst (e.g., read burst) is valid in time to satisfy deterministic latency requirements, such as the tRCD parameter (e.g., 30 ns, 6 clock periods), or the CL parameter, or the sum of the tRCD and CL parameters, for example. In some implementations, the memory 130 may detect errors in the data to be buffered, but may be unable to perform the necessary error-correction in time to satisfy the tRCD parameter, or the CL parameter, or the sum of the tRCD and CL parameters. In other implementations, the DNV signal 127 may correspond to a condition where performing address translation (e.g., logical address translation) and/or locating requested data in memory 130 (e.g., in a cache memory or content-addressable memory) may require more time than permitted by deterministic latency requirements.

In various implementations the DNV signal 127 may change or transition within a read burst. For example, one or more words of a read burst may be sampled from a buffer prior to completion of error-correction, while one or more subsequent words of the same read burst may be sampled from the buffer after completion of error-correction. As such, the state of the DNV signal 127 may transition during a read burst. In some cases, the DNV signal 127 may change for every word. In general, once the DNV signal transitions to FALSE, the DNV signal 127 will remain FALSE for any subsequent READ command to pull data from the same buffer.

In various embodiments, the DNV signal 127 may be driven by an extra pin (e.g., DNV pin) added to the memory bus driving the DQ signal 126. For example, the DNV pin may comprise pin DQ[16] added to a 16 pin data bus DQ[15:0]. The DNV pin may comprise an output-only pin and/or may be input/output if multiplexed, for example. Depending on the bus speed, the DNV pin and its printed circuit board (PCB) may be treated similar to the data bus DQ[15:0] for signal integrity purposes. In various implementations, the memory controller 110 may use the clock signal 121 (e.g., CK+ signal) and the DQS signal 125 to sample the DNV pin.

In various embodiments, the DNV signal 127 is not driven when the DQ signal 125 is not driven. For example, when the memory 130 tristates the data bus DQ[15:0], the memory 130 also tristates the DNV pin. Whenever the memory 130 drives the data bus DQ[15:0], the memory 130 also may drive the DNV signal 127.

In various implementations, the DNV signal 127 may comprise a high impedance state signal having a high, low, and high impedance (e.g., intermediate) state and capable of being shared by multiple chips. In various embodiments, the DNV signal 127 is not actively driven by the memory 130 during certain time phases, allowing the signal to be shared and driven by multiple chips. When no chips are driving the DNV signal 127 (e.g., forcing a voltage), the DNV signal 127 may remain in the high impedance state, or may be driven to a known state by the memory controller 110, or may be held in a known state by a passive resistor. In various implementations, the high impedance DNV signal 127 may be shared by multiple chips working together to drive the DQ bus.

In various embodiments, the memory controller 110 may be arranged to receive a DQ signal 126 including a read burst comprising multiple words with a DNV signal 127 indicating one or more of the words may be invalid or cannot be guaranteed to be valid. In various implementations, if the DNV signal 127 is TRUE when sampled at the same time as each word of the read burst on the DQ signal 126, the memory controller 110 may be arranged to discard the entire read burst and/or only those words not guaranteed to be valid. In such implementations, the memory controller 110 may schedule a new READ command to initiate a new read burst. In some embodiments, the memory controller 110 may be arranged to attempt to fetch only the invalid words. It is noted that the memory controller 110 should not send a new ACTIVE command, because the original ACTIVE command eventually, after some variable latency, may result in corrected valid data availability, and subsequent read bursts from the row buffer may deliver valid words.

As shown, the memory 130 may comprise a memory array 131. The memory array 131 may be implemented, for example, by volatile and/or non-volatile storage cells, such as volatile SDRAM cells and/or non-volatile NOR or NAND flash cells. In various embodiments, the memory array 131 may comprise multiple memory banks, each allowing simultaneous access to stored data. In one embodiment, the memory array 131 may comprise four memory banks (e.g., a, b, c, and d). In various implementations, a particular memory bank (e.g., a) may be selected by a bank address signal 123 (e.g., Bank a). The embodiments are not limited in this context.

In various embodiments, the memory array 131 may be arranged to store information as payload data. By the nature of physics, however, the memory array 131 may not be perfectly reliable. As such, an encoding scheme (e.g., mathematical algorithm) may be applied to the payload data to generate error-correction codes (ECCs) to be added to and/or stored with the payload data. The ECCs may comprise, for example, parity bits and/or redundancy bits to determine errors in the payload data.

The memory 130 may comprise an address decoder 132. In various embodiments, the address decoder 132 may comprise a row decoder implemented by a multiplexer, for example. In such embodiments, the address decoder 132 may be arranged to perform address decoding in response to an address signal 122 (e.g., RA signal), a bank address signal 123 (e.g., Bank a), and a command signal 124 (e.g., ACTIVE command) from the memory controller 110. In various implementations, the address decoder 132 may activate a particular row in one or the memory banks of the memory array 131.

In some embodiments, the memory 130 may comprise an address translator 133 to perform address translation. In such embodiments, the address translator 133 may provide the memory 130 with an extra layer of abstraction to enable the memory controller 110 to request data by a logical address (e.g., file name) rather than by specific physical address. The address translator 133 may be required to perform translation from a logical address to a physical address, which may be dynamic. In most cases, address translation may be performed quickly enough to satisfy deterministic latency requirements, such as the tRCD parameter (e.g., 30 ns, 6 clock periods), or the CL parameter, or the sum of the tRCD and CL parameters, for example. The tRCD parameter may comprise the minimum delay for the memory controller 110 to issue a READ command after issuing an ACTIVATE command. The CL parameter may comprise the time delay between the READ command and receiving the first datum word. In some cases, however, the address translation may require more time than permitted by deterministic latency requirements.

In various embodiments, the memory 130 may comprise a cache memory to store frequently and/or recently accessed data. In many cases, the memory 130 may be able to locate requested data using the cache memory quickly enough to satisfy deterministic latency requirements, such as the tRCD parameter (e.g., 30 ns, 6 clock periods), or the CL parameter, or the sum of the tRCD and CL parameters, for example. In some cases, however, locating the requested data may require more time than permitted by deterministic latency requirements.

The memory 130 may comprise one or more sense amplifiers 134. In various embodiments, a sense amplifier 134 may be arranged to sense and pull data from a row activated in the memory array 131. In various implementations, the sense amplifiers 134 also may be arranged to pull ECCs with the row data (e.g., payload data).

The memory 130 may comprise an error-detection and correction (EDC) circuit 135. In various embodiments, the EDC circuit 135 may be arranged to receive the sensed data (e.g., payload data) and ECCs from one or more sense amplifiers 134, to detect errors in the sensed data using the ECCs, and to perform error-correction. In various implementations, the EDC circuit 135 may determine that the sensed data contains one or more bit errors, identify one or more erroneous bits, and then correct the sensed data by repairing (e.g., inverting) the erroneous bits.

The memory may comprise a row buffer 136. In various embodiments, the row buffer 136 may be arranged to latch output (e.g., sensed row data) from the EDC circuit 135. The row buffer 136 generally may comprise any type of data structure capable of storing row data, such as a group of latches. In various implementations, the row buffer may comprise, for example, a 1 KB or 2 KB group of latches.

The memory 130 may comprise RowBufferNotValid (RBNV) latch 137. In various embodiments, the RBNV latch 137 may comprise a one-bit latch or flag. The RBNV latch 137 may comprise, for example, an addition to the row buffer 136. For example, the size of the row buffer 136 may be increased by an extra bit that latches an output from the EDC 135. In various implementations, the RBNV latch 137 may be set to TRUE (e.g., TRUE=1) indicating the row buffer 136 may not hold valid data or set to FALSE (e.g., FALSE=0) indicating the row buffer contains only valid data.

In various embodiments, the RBNV latch 137 may comprise an initial state of TRUE. For example, the RBNV latch 137 may be arranged to be set to TRUE in response to an ACTIVE command before starting the internal sensing operation. In various implementations, the EDC circuit 135 may determine that the sensed row data is valid (e.g., error-free data and/or corrected), latch valid row data to the row buffer 136, and set or clear the RBNV latch 137 to FALSE (e.g., FALSE=0).

In a large majority of cases, the EDC circuitry 135 may determine that the row data is valid quickly enough to satisfy deterministic latency requirements. For example, the EDC circuit 135 may determine that the sensed data is error-free data and/or complete error detection and correction in time to satisfy the tRCD parameter (e.g., 30 ns, 6 clock periods), or the CL parameter, or the sum of the tRCD and CL parameters, for example. The tRCD parameter may comprise the minimum delay for the memory controller 110 to issue a READ command after issuing an ACTIVATE command. The CL parameter may comprise the time delay between the READ command and receiving the first datum word. In cases where the EDC 135 determines that the row data is valid in time to satisfy tRCD, valid row data may be latched to the row buffer 136 in time to respond to a READ command with valid data from the row buffer 136.

In a very small minority of cases, however, the EDC circuit 135 might conclude the sensed data has an unusual type of error requiring a more complex and time intensive error-correction method. In various embodiments, the EDC circuit 135 may be arranged to implement dual-stage error-correction by performing a second-level of slower internal error-correction. Dual-stage error-correction may be required for rare occurrences of 2-bit error-correction in addition to frequent occurrences of 1 bit error-correction, for example. In such embodiments, however, there may be a finite limit to the amount of errors that can be corrected. In addition, while the EDC circuit 135 may be able detect multiple errors quickly, the EDC circuit 135 may require more time to correct those multiple errors than permitted by deterministic latency requirements, such as the tRCD parameter (e.g., 30 ns, 6 clock periods), or the CL parameter, or the sum of the tRCD and CL parameters, for example.

In various implementations, the EDC circuit 135 may be unable to determine (e.g., guarantee) that the sensed row data is valid (e.g., error-free data and/or corrected) in time to satisfy deterministic latency requirements, such as the tRCD parameter. Similarly, in some implementations, performing logical address translation and/or locating the requested data in a cache scheme may require more time than permitted by deterministic latency requirements.

In such implementations, the EDC circuit 135 may set or keep the RBNV latch 137 latch to TRUE. In this case, the RBNV latch 137 remains set to TRUE even after the required deterministic latency (e.g., tRCD). In various embodiments, the EDC circuit 135 may latch potentially invalid and/or erroneous data to the row buffer 136 and continue to perform the necessary error-correction. After completing the slower error-correction, the EDC circuit 135 may latch the corrected valid data to the row buffer 136, and then set or clear the RBNV latch 137 to FALSE (e.g., FALSE=0).

The memory may comprise a state machine 138. In various embodiments, the state machine 138 may receive an address signal 122 (e.g., CA signal), a bank address signal 123 (e.g., Bank a), and a command signal 124 (e.g., READ command) from the memory controller 110. In various implementations, the state machine 138 may receive a READ command issued from the memory controller 110 according to a deterministic latency parameter, such as tRCD. In general, the memory controller 110 may be unaware of the state of the RBNV latch 137 at the time a READ command is issued. As such, the memory controller 110 may issue a READ command on schedule after issuing an ACTIVE command in accordance with the deterministic latency parameter tRCD and/or depending on available timeslots in the scheduler pipeline.

The memory 130 may comprise an address decoder 139. In various embodiments, the address decoder 139 may comprise a column decoder implemented by a multiplexer, for example. In such embodiments, the address decoder 139 may be arranged to perform address decoding in response to an address signal 122 (e.g., CA signal), a bank address signal 123 (e.g., Bank a), and a command signal 124 (e.g., READ command).

In various implementations, the state machine 138 may be arranged to fetch data from the row buffer 136 via the address decoder 139. In various embodiments, the state machine 138 may respond to the READ command by fetching data, even when the EDC circuit 135 has determined that the data sent to the row buffer cannot be determined (e.g., guaranteed) to be valid. In some cases, the state machine 138 may employ a 2n-prefetch to pull two words at a time from the row buffer 136. For a BL of four, the four words may be pulled using two time phases. The data pulled from the row buffer 136 may be driven through an output driver 140 onto the data bus as DQ signal 126.

In various embodiments, each time one or more words are pulled from the row buffer 136, the state machine 138 may pull data from the RBNV latch 137 through a sense amplifier 141. In various implementations, the RBNV latch 137 may be pulled so that the value can be driven via output driver 142 on the DNV pin during the time phases when the one or more words are driven on the DQ data bus.

In various implementations, one or more words of a read burst may be pulled from the row buffer 136 prior to completion of error-correction by the EDC circuit 135, while one or more subsequent words of the same read burst may be pulled from the row buffer after the EDC circuit 135 has completed error-correction and latched the corrected data into the row buffer 136. In such implementations, the state of the DNV pin and the DNV signal 127 may transition during a read burst. When using 2n-prefetch, for example, the DNV pin may be sampled with the rising edge of the DQS signal 125 and may be expected to change between pairs of words of a read burst. In some embodiments, the DNV pin and DNV signal 127 may change for every word of a read burst. In general, once the DNV signal transitions to FALSE, the DNV signal will remain FALSE for any subsequent READ command to pull data from the same row buffer.

In various embodiments, the memory controller 110 may be arranged to receive a DQ signal 126 including a read burst comprising multiple words with a DNV signal 127 indicating one or more of the words may be invalid or cannot be guaranteed to be valid. In various implementations, if the DNV signal 127 is TRUE when sampled at the same time as each word of the read burst on the DQ signal 126, the memory controller 110 may be arranged to discard the entire read burst and/or only those words not guaranteed to be valid. In such implementations, the memory controller 110 may schedule a new READ command to initiate a new read burst. In some embodiments, the memory controller 110 may be arranged to attempt to fetch only the invalid words. It is noted that the memory controller 110 should not send a new ACTIVE command, because the original ACTIVE command eventually, after some variable latency, may result in corrected valid data availability, and subsequent read bursts from the row buffer may deliver valid words.

In various embodiments, the memory system 100 may support non-deterministic variable sensing latency. In various implementations, the memory system 100 provides the option of dynamically increasing the memory sensing latency in those rare instances when more time is required than permitted by deterministic latency parameters, such as the tRCD parameter, or the CL parameter, or the sum of the tRCD and CL parameters, for example.

Figure 2:
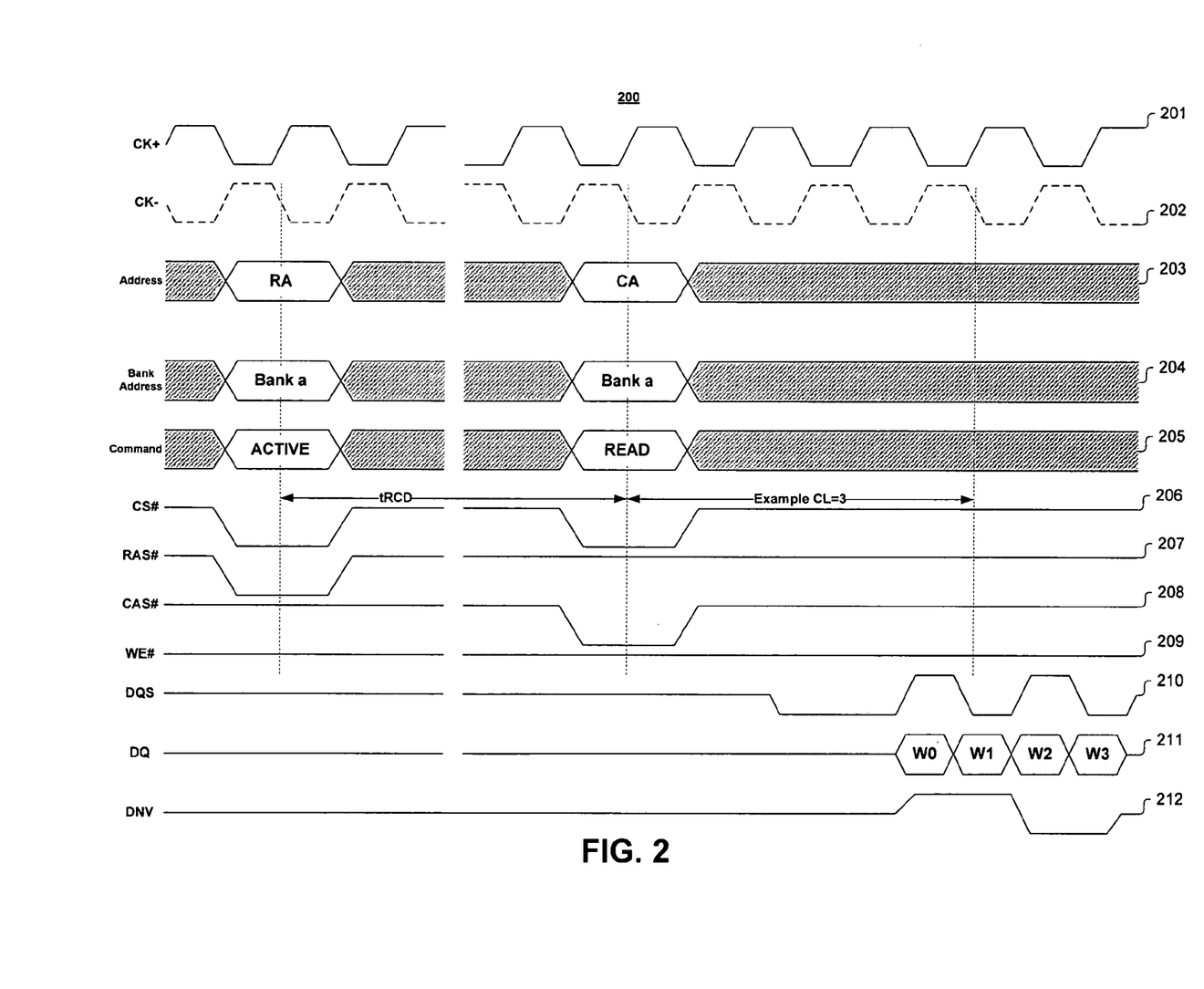
FIG. 2 illustrates one embodiment of a timing diagram.

FIG. 2 illustrates one embodiment of a timing diagram 200. In various embodiments, the timing diagram 200 may illustrate waveforms corresponding to signals (e.g., signals 121-127) communicated by a memory system (e.g., memory system 100). The embodiments, however, are not limited in this context.

The timing diagram 200 may comprise CK+ waveform 201 and CK− waveform 202. As shown, a clock signal (e.g., CK+ signal, CK− signal) may comprise a differential clock.

The timing diagram 200 may comprise address waveform 203, bank address waveform 204, and command waveform 205. As shown, address signals (e.g., RA signal, CA signal), bank address signals (e.g., Bank a signals), and command signals (e.g., ACTIVE command, READ command) may be synchronized on the rising edge of a clock signal (e.g., CK+ signal). As also shown, a READ command may be issued after an ACTIVE command in accordance with the deterministic latency parameter tRCD (e.g., tRCD=6 clock periods).

The timing diagram 200 may comprise CS# waveform 206, RAS# waveform 207, CAS# waveform 208, and WE# waveform 209. As shown, an ACTIVE command may comprise a low CS# signal, a low RAS# signal, a high CAS# signal, and a high WE# signal. As also shown, A READ command may comprise a low CS# signal, a high RAS# signal, a low CAS# signal, and a high WE# signal.

The timing diagram may comprise a DQS waveform 210 and DQ waveform 211. As shown, a DQS signal may comprise a signal with a high impedance state and also having rising and falling edge transitions corresponding to the arrival of words driven on a DQ signal. The DQ signal may comprise a signal with a high impedance state and also including four words (e.g., W0, W1, W2, and W3) corresponding to a BL (e.g., BL=4). When word W0 and word W2 are driven on the DQ signal, a rising edge transition is driven on the DQS signal. When word W1 and word W3 are driven on the DQ signal, a falling edge is driven on the DQS signal. As also shown, the arrival of word W0 may satisfy the deterministic latency parameter CL (e.g., CL=3 clock periods).

The timing diagram 200 may comprise DNV waveform 212. As shown, a DNV signal may comprise a signal with a high impedance state and also having a high state (logic "TRUE") indicating that one or more words of a DQ signal (e.g., word W0 and W1) may be invalid or cannot be guaranteed to be valid, and also having a low state (logic "FALSE") indicating that one or more words within a read burst (e.g., W2 and W3) are guaranteed to be valid. In general, once the DNV signal transitions to FALSE, the DNV signal will remain FALSE for any subsequent READ command to pull data from the same row buffer. As also shown, the DNV signal is driven when the DQ signal is driven and is not driven when the DQ signal is not driven. It is noted that the DQS signal also may be used to recognize the arrival of DNV signal.

It can be appreciated that the timing diagram 200 illustrates only one example of many possible waveforms. For example, while the DNV waveform 212 shows a DNV signal that is TRUE (e.g., high) during word W0 and W1 of DQ signal and FALSE during word W2 and word W3, in some cases, the DNV signal may change for every word. In addition, the timing diagram 200 may be extended to also show a later phase of time when a second READ command is delivered to attempt to fetch again the burst invalid words W0 and W1.

Operations for various embodiments may be further described with reference to the following figures and accompanying examples. Some of the figures may include a logic flow. It can be appreciated that the logic flow merely provides one example of how the described functionality may be implemented. Further, the given logic flow does not necessarily have to be executed in the order presented unless otherwise indicated. In addition, the logic flow may be implemented by a hardware element, a software element executed by a processor, or any combination thereof. The embodiments are not limited in this context.

Figure 3:
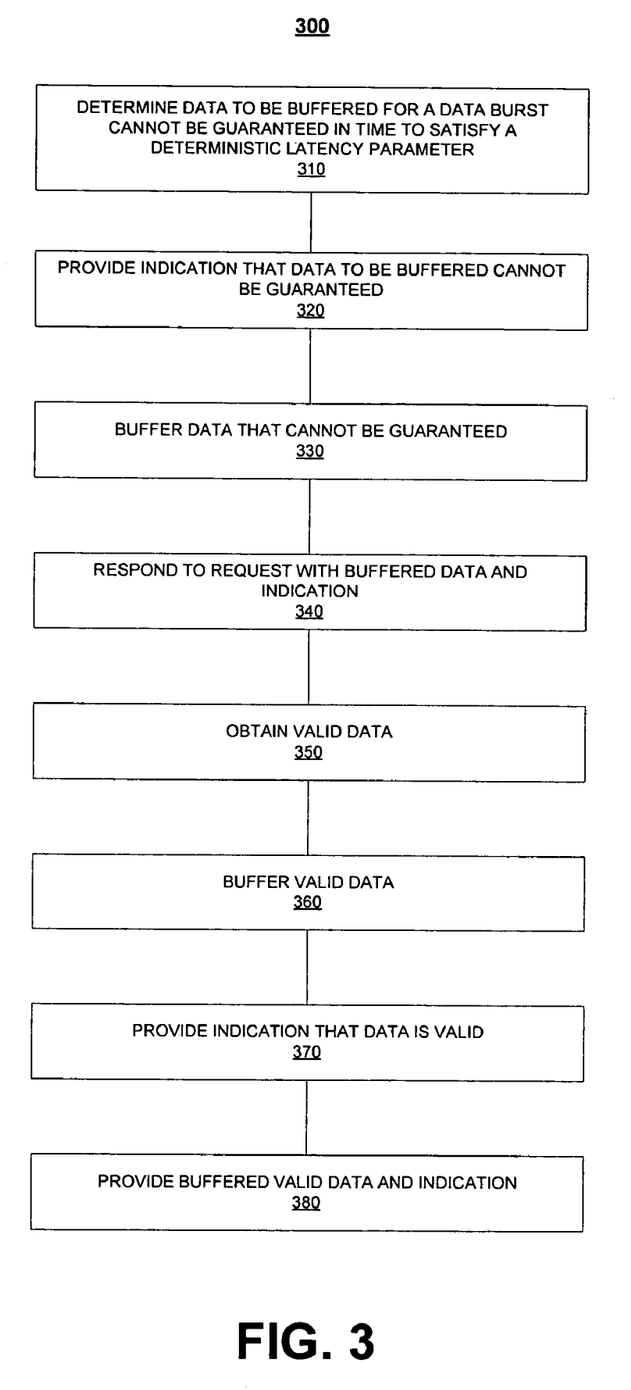
FIG. 3 illustrates one embodiment of a logic flow.

FIG. 3 illustrates one embodiment of a logic flow 300. FIG. 3 illustrates logic flow 300 for non-volatile memory buffering. In various embodiments, the logic flow 300 may be implemented by one or more elements of system (e.g., memory system 100) and according to signals corresponding to the waveforms illustrated by diagram 200. It can be appreciated that the logic flow 300 may be implemented by various other types of hardware, logic, and/or combination thereof.

In various embodiments, the logic flow 300 may comprise determining that data to be buffered for a data burst cannot be guaranteed in time to satisfy a deterministic latency parameter (block 310). The data may be buffered in response to an ACTIVE command. The data burst may comprise, for example, a read bust including multiple words. The deterministic latency parameter may comprise a tRCD parameter. The tRCD parameter may comprise a minimum delay between issuing an ACTIVE command and issuing a READ command to the same memory bank in a memory. In various implementations, the tRCD parameter may account for error-correction delay. The tRCD parameter may be expressed in terms of nanoseconds (e.g., 30 ns) and/or clock periods (e.g., 6 clock periods depending on the clock frequency).

In some implementations, the data to be buffered is invalid or cannot be guaranteed to be valid. In such implementations, the determination may be made by performing error detection and/or error-correction. In other implementations, the data to be buffered cannot be guaranteed as a result of address translation (e.g., logical address translation) and/or locating requested data (e.g., in a cache memory or content-addressable memory) requiring more time than permitted by the deterministic latency parameter.

In various embodiments, the logic flow 300 may comprise providing an indication that data to be buffered for a data burst cannot be guaranteed (step 320). Latching an indication may comprise setting a latch or flag. Providing the indication may comprise, for example, latching a one-bit addition to a data bus. In various implementations, the indication may comprise a transition within a read burst.

In various embodiments, the logic flow 300 may comprise buffering the data determined to be invalid or that cannot be guaranteed (block 330). In various implementations, the data, while invalid or uncertain, may be buffered in time to satisfy the deterministic latency parameter.

In various embodiments, the logic flow 300 may comprise responding to a request for the data with the buffered data and the indication that the buffered data may be invalid or cannot be guaranteed (block 340). The request may comprise, for example, a read burst. In various implementations, the response may be provided to a memory controller.

In various embodiments, the logic flow 300 may comprise obtaining valid data (block 350). Obtaining the valid data may result from performing error-correction, address translation, and/or locating requested data.

In various embodiments, the logic flow 300 may comprise, buffering the valid data (block 360), providing an indication that the data is valid (block 370), and providing the buffered valid data with the indication that the data is valid (block 380).

In various embodiments, the logic flow 300 may support non-deterministic variable sensing latency. In various implementations, the logic flow 300 provides the option of dynamically increasing the memory sensing latency in those rare instances when more time is required than permitted by deterministic latency parameters, such as the tRCD.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

In various implementations, the described embodiments may comprise, or form part of a wired communication system, a wireless communication system, or a combination of both. Although certain embodiments may be illustrated using a particular communications media by way of example, it may be appreciated that the principles and techniques discussed herein may be implemented using various communication media and accompanying technology.

In various implementations, the described embodiments may be arranged to receive information over one or more communications media. Communications media generally may comprise any medium capable of carrying information signals. For example, communication media may comprise wired communication media, wireless communication media, or a combination of both, as desired for a given implementation. Examples of wired communications media may include a wire, cable, printed circuit board (PCB), backplane, switch fabric, semiconductor material, twisted-pair wire, co-axial cable, fiber optics, and so forth. An example of a wireless communication media may include portions of a wireless spectrum, such as the radio-frequency (RF) spectrum. The embodiments are not limited in this context.

In various embodiments, for example, the described memory systems and techniques may comprise or be implemented by a wireless device such as a mobile telephone, handheld computer, personal digital assistant (PDA), combination mobile telephone/PDA, data transmission device, handset, one-way pager, two-way pager, a wireless access point, a base station (BS), a subscriber station (SS), a mobile subscriber center (MSC), a radio network controller (RNC), and so forth. When implemented as a wireless device, the memory system 100 may include components and interfaces for wireless communication, such as one or more antennas, transmitters, receivers, transceivers, amplifiers, filters, control logic, and so forth.

In some embodiments, the described memory systems and techniques may comprise, or be implemented as a personal computer (PC), a laptop, a digital music player, a computer system or sub-system, an appliance, a workstation, a terminal, a server, a set top box (STB), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chipset, a chip, die, or other device, machine, tool, equipment, component, or combination thereof.

In various implementations, the described embodiments may comprise or form part of a network, such as a Wide Area Network (WAN), a Local Area Network (LAN), a Metropolitan Area Network (MAN), a wireless WAN (WWAN), a wireless LAN (WLAN), a wireless MAN (WMAN), a wireless personal area network (WPAN), a WiMAX network, a broadband wireless access (BWA) network, the Internet, the World Wide Web, a telephone network, a radio network, a television network, a cable network, a satellite network, a Code Division Multiple Access (CDMA) network, a third generation (3G) network such as Wide-band CDMA (WCDMA), a fourth generation (4G) network, a Time Division Multiple Access (TDMA) network, an Extended-TDMA (E-TDMA) cellular radiotelephone network, a Global System for Mobile Communications (GSM) network, a Synchronous Division Multiple Access (SDMA) network, a Time Division Synchronous CDMA (TD-SCDMA) network, an Orthogonal Frequency Division Multiplexing (OFDM) network, an Orthogonal Frequency Division Multiple Access (OFDMA) network, a North American Digital Cellular (NADC) cellular radiotelephone network, a Narrowband Advanced Mobile Phone Service (NAMPS) network, a Universal Mobile Telephone System (UMTS) network, and/or any other wired or wireless communications network configured to carry data. The embodiments are not limited in this context.

In various implementations, the described embodiments may employ one or more protocols such as medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), and so forth.

In various implementations, the described embodiments may be arranged to communicate in accordance with a number of wireless protocols. Examples of wireless protocols may include various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may include various WWAN protocols, such as GSM cellular radiotelephone system protocols with GPRS, CDMA cellular radiotelephone communication systems with 1xRTT, EDGE systems, EV-DO systems, EV-DV systems, HSDPA systems, and so forth. Further examples of wireless protocols may include WPAN protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may include near-field communication techniques and protocols, such as electromagnetic induction (EMI) techniques. An example of EMI techniques may include passive or active radio-frequency identification (RFID) protocols and devices. Other suitable protocols may include Ultra Wide Band (UWB), Digital Office (DO), Digital Home, Trusted Platform Module (TPM), ZigBee, and other protocols. The embodiments are not limited in this context.

In various implementations, the described embodiments may be arranged to communicate using a number of different WWAN data communication services. Examples of cellular data communication systems offering WWAN data communication services may include a GSM with General Packet Radio Service (GPRS) systems (GSM/GPRS), CDMA/1xRTT systems, Enhanced Data Rates for Global Evolution (EDGE) systems, Evolution Data Only or Evolution Data Optimized (EV-DO) systems, Evolution For Data and Voice (EV-DV) systems, High Speed Downlink Packet Access (HSDPA) systems, and so forth. The embodiments are not limited in this respect.

In various embodiments, communications media may be connected to a network element using an input/output (I/O) adapter. The I/O adapter may be arranged to operate with any suitable technique for controlling information signals using a desired set of communications protocols, services or operating procedures. The I/O adapter may also include the appropriate physical connectors to connect the I/O adapter with a corresponding communications medium. Examples of an I/O adapter may include a network interface, a network interface card (NIC), disc controller, video controller, audio controller, and so forth. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, punched paper cards, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an ASIC, PLD or DSP, and so forth. In yet another example, an embodiment may be implemented by any combination of programmed general-purpose computer components and custom hardware components. The embodiments are not limited in this context.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus comprising:
   a memory controller to determine that data to be buffered for a data burst will not satisfy a deterministic latency parameter, said memory controller to provide an indication that said deterministic latency parameter will not be satisfied.

2. The apparatus of claim 1, said memory controller to buffer said data that will not satisfy said deterministic latency parameter.

3. The apparatus of claim 1, said memory controller to respond to a request for said data with buffered data and said indication.

4. The apparatus of claim 1, said deterministic latency parameter comprising a minimum delay between issuing an ACTIVE command and issuing a READ command to said memory plus a minimum delay between said READ command and resulting data driven on data bus.

5. The apparatus of claim 1, said memory controller to determine said data will not satisfy a deterministic latency parameter by performing one or more of error detection, error-correction, address translation, and locating requested data.

6. A system comprising:
   a memory controller; and
   a memory coupled to said memory controller, said memory controller to determine that data to be buffered for a data burst will not satisfy a deterministic latency parameter, said memory controller to provide an indication that said deterministic latency parameter will not be satisfied.

7. The system of claim 6, said memory controller to buffer said data that will not satisfy said deterministic latency parameter.

8. The system of claim 6, said memory controller to respond to a request for said data with buffered data and said indication.

9. The system of claim 6, said deterministic latency parameter comprising a minimum delay between issuing an ACTIVE command and issuing a READ command to said memory plus a minimum delay between said READ command and resulting data driven on data bus.

10. The system of claim 6, said memory controller to determine said data will not satisfy a deterministic latency parameter by performing one or more of error detection, error-correction, address translation, and locating requested data.

11. A method comprising:
    determining that data to be buffered for a data burst will not satisfy a deterministic latency parameter; and
    providing an indication that said data will not satisfy a deterministic latency parameter.

12. The method of claim 11, further comprising buffering said data that will not satisfy said deterministic latency parameter.

13. The method of claim 11, further comprising responding to a request for said data with buffered data and said indication.

14. The method of claim 11, said deterministic latency parameter comprising a minimum delay between issuing an ACTIVE command and issuing a READ command to said memory plus a minimum delay between said READ command and resulting data driven on data bus.

15. The method of claim 11, further comprising performing error detection.

16. The method of claim 11, further comprising performing error-correction.

17. The method of claim 11, further comprising performing logical address translation.

18. The method of claim 11, further comprising locating requested data.

19. The method of claim 11, further comprising obtaining valid data.

20. The method of 19, further comprising providing an indication that data is valid.

\* \* \* \* \*